US 6,656,378 B2

(12) United States Patent
Kwon et al.

(10) Patent No.: US 6,656,378 B2
(45) Date of Patent: Dec. 2, 2003

(54) PIEZOELECTRIC CERAMIC COMPOSITION REDUCING LEAKAGE CURRENT AND PIEZOELECTRIC DEVICE USING THE SAME

(75) Inventors: Sang Koo Kwon, Suwon (KR); Kang Heon Hur, Suwon (KR); Jong Kuk Hong, Choongchungnam-do (KR); Dong Hwan Seo, Suwon (KR)

(73) Assignee: S-Cera Co., Ltd., Kyunggi-Do (KR)

( * ) Notice: Subject to any disclaimer, the term of this patent is extended or adjusted under 35 U.S.C. 154(b) by 57 days.

(21) Appl. No.: 10/067,814

(22) Filed: Feb. 8, 2002

(65) Prior Publication Data

US 2003/0132418 A1 Jul. 17, 2003

(30) Foreign Application Priority Data

Dec. 27, 2001 (KR) .......................... 2001-86412

(51) Int. Cl.$^7$ ..................... H01L 41/187; C04B 35/493
(52) U.S. Cl. ................. 252/62.9 PZ; 501/134; 310/311
(58) Field of Search ................. 252/62.9 PZ; 501/134; 310/311

(56) References Cited

U.S. PATENT DOCUMENTS 4,128,489 A * 12/1978 Seo ..................... 252/62.9 R
6,123,867 A    9/2000 Takahashi et al.

FOREIGN PATENT DOCUMENTS

| JP | 51-7318  | 3/1976 |
|----|----------|--------|
| JP | 52-17239 | 2/1977 |
| JP | 54-32516 | 3/1979 |
| JP | 54-36757 | 3/1979 |

OTHER PUBLICATIONS

Bibliography and Abstract of Japanese Patent Application No. JP19950335120 19951222 Published Sep. 17, 1996.
Bibliography and Abstract of Japanese Patent Application No. JP19950304685 19951122 Published Jun. 3, 1997.

* cited by examiner

*Primary Examiner*—C. Melissa Koslow
(74) *Attorney, Agent, or Firm*—Lowe Hauptman Gilman & Berner LLP

(57) ABSTRACT

Disclosed is a piezoelectric ceramic composition comprising a PZT piezoelectric composition, a B-site of which is substituted with a certain material, and chromium oxide, and a piezoelectric device using the piezoelectric ceramic composition. The piezoelectric ceramic composition has good heat resistance and frequency stability, and reduces a leakage current. There is provided the piezoelectric ceramic composition comprising a main component expressed by $Pb[(Co_{1/2}W_{1/2})_x Ti_{1-x-y} Zr_y]O_3$ (wherein, $0.001 \leq x \leq 0.04$, and $0.35 \leq y \leq 0.55$), $Cr_2O_3$ in an amount of 0.01 to 2 wt %, $MnO_2$ in an amount of 0.1 to 0.5 wt %, and an additive in an amount of 0.01 to 2.0 wt %, based on the total weight of the piezoelectric ceramic composition, in which the additive is selected from the group consisting of CoO, MgO, ZnO, $Al_2O_3$, $Fe_2O_3$, $Sb_2O_3$, $SnO_2$, $CeO_2$, $Nb_2O_5$, $V_2O_5$ and $WO_3$, and mixtures thereof. The piezoelectric ceramic composition satisfies piezoelectric properties such as kp and Qm needed for a piezoelectric material, and is 320° C. or higher in phase transition temperature, ±30 ppm/° C. in TCF, and 0.1% or less in oscillation frequency change after reflow; and the piezoelectric ceramic composition also has good piezoelectric properties such that the leakage current is reduced.

9 Claims, No Drawings

PIEZOELECTRIC CERAMIC COMPOSITION REDUCING LEAKAGE CURRENT AND PIEZOELECTRIC DEVICE USING THE SAME

BACKGROUND OF THE INVENTION

1. Field of the Invention

The present invention relates, in general, to a piezoelectric ceramic composition reducing a leakage current and a piezoelectric device using the same and, in particular, to a piezoelectric ceramic composition in which a B-site of the PZT piezoelectric ceramic composition is substituted with a certain material, and chromium oxide is added, and a piezoelectric device using the piezoelectric ceramic composition. The piezoelectric ceramic composition has good heat resistance and frequency stability, and reduces a leakage current.

2. Description of the Prior Art

A recent piezoelectric sensor is widely used in a ceramic resonator, a ceramic filter, a piezoelectric transducer, a piezoelectric buzzer, an ultrasonic oscillator, or the like. For example, a kHz-range SMD (surface mounted device) type filter, which is an essential part in recent information technology, is commonly used to produce two layered IF filters in devices such as a pager, AMPS (Advanced Mobile Phone Service System), wireless transmitting/receiving apparatus, wire/wireless hands-free kit, and wireless network. Use of the piezoelectric sensor is continuously expanding, and more advanced electrical/piezoelectric properties of the piezoelectric sensor are required according to developments in sensitivity of piezoelectric sensors.

According to the great advances in the information technology, demand for a light weight, small-sized, and highly efficient electronic material and frequency stability of the electronic material is increased.

Particularly, when SMD type chip parts are used, they should be passed through a reflow process. Accordingly, a material is required which has piezoelectric properties unaffected by the reflow process, and resistance to high temperatures.

However, conventional piezoelectric compositions have low heat resistance owing to low Tc (phase transition temperature), and changes in their piezoelectric properties and frequency stability after the reflow process are large, so that a high value-added SMD type filter can hardly be produced from conventional piezoelectric compositions. Also, various electronic products cannot be produced and a competitive power of products is poor because the piezoelectric properties of the conventional piezoelectric composition are difficult to control.

To secure the heat resistance of the material and stabilize frequency and the piezoelectric properties of the material after the reflow process, studies have been conducted for stabilizing a heat resistance, as well as a frequency change, a capacitance change, and a coupling factor (k) change after the reflow process according to a oscillation mode by using a piezoelectric composition comprising Pb(Zr, Ti) $O_3$ as a main component and additives such as Mn, Y, Dy, Er, Ho, Lu, and Yb.

For example, U.S. Pat. No. 6,123,867 discloses a piezoelectric ceramic composition comprising Pb[(M, Nb) Zr, Ti]$O_3$ as a main component and additives, and a piezoelectric device using the piezoelectric ceramic composition, which can stabilize a heat resistance, as well as a frequency change ratio, a capacitance change ratio, and a coupling factor (k) change ratio after the reflow process.

Furthermore, a Pb(Zn Nb) (Sn, Nb) TiZrO$_3$ based composition disclosed in Japanese Patent Publication Nos. Sho. 52-17239 and Sho. 51-7318 and a Pb(Sn, Sb)TiZrO$_3$ based composition disclosed in Japanese Patent Publication Nos. Sho. 54-32516 and Sho. 54-36757 are suitable for use in a high frequency ceramic oscillator or filter, because of their excellent piezoelectricity and small size of crystal grains, as well as ease in removing impurities during sintering thereof. Therefore, these piezoelectric ceramic compositions are used in ceramic filters, ceramic oscillators, piezoelectric transducers, ceramic sensors or the like.

Additionally, Japanese Laid-Open Patent Publication Nos. Hei. 8-239269 and Hei. 9-142930 disclose materials that are not affected by heat, in which a composite oxide of Y, Nb or the like is the main component of PZT, or Cr is added thereto.

However, the characteristics of the conventional piezoelectric ceramic composition change because of poor heat resistance, and drift occurs upon heating. Therefore, the piezoelectric device has poor reliability and disadvantages in mass production. In other words, when a piezoelectric device formed of the conventional piezoelectric ceramic composition is heated at 150° C. for 1 hour, the resonance frequency fr changes by several % immediately after the heat treatment, when compared to that before the heat treatment.

Additionally, a reflow temperature is higher and a temperature of an element heated is also higher because SMT type electronic parts such as ceramic filters and ceramic oscillators are commonly used. Accordingly, the piezoelectric properties of the piezoelectric ceramics before the heat treatment are different from those after the heat treatment. That is to say, there is a problem that the piezoelectric properties—such as resonance frequency—of the piezoelectric ceramics before the heat treatment are different from those after the heat treatment, when such piezoelectric ceramics are heated to a temperature of about 250° C. and then cooled to room temperature in order to reflow the piezoelectric device.

Furthermore, there is another problem that a leakage current becomes large and thus a voltage is nonuniform when the conventional piezoelectric composition is polarized, therefore dispersion is large and productivity is poor while the piezoelectric device is produced.

SUMMARY OF THE INVENTION

Therefore, it is an object of the present invention to provide a piezoelectric ceramic composition with an excellent heat resistance and frequency stability, which is low in leakage current.

It is another object of the present invention to provide the piezoelectric ceramic composition which has a minimum dispersion owing to a reduction of the leakage current and which can be manufactured to piezoelectric devices at high production yield.

It is yet another object of the present invention to provide a piezoelectric device using the piezoelectric ceramic composition, in which the piezoelectric ceramic composition has an excellent heat resistance and frequency stability and reduces a leakage current.

DETAILED DESCRIPTION OF THE INVENTION

According to an embodiment of the present invention, a piezoelectric ceramic composition is provided, which comprises a main component expressed by $Pb[(Co_{1/2}W_{1/2})_x Ti_{1-x-y}Zr_y]O_3$ (wherein, $0.001 \leq x \leq 0.04$, and $0.35 \leq y \leq 0.55$), $Cr_2O_3$ in an amount of 0.01 to 2 wt %, $MnO_2$ in an amount of 0.1 to 0.5 wt %, and an additive in an amount of 0.01 to 2.0 wt %, based on the total weight of the piezoelectric ceramic composition. The additive is selected from the group consisting of CoO, MgO, ZnO, $Al_2O_3$, $Fe_2O_3$, $Sb_2O_3$, $SnO_2$, $CeO_2$, $Nb_2O_5$, $V_2O_5$ and $WO_3$, and mixtures thereof.

According to another embodiment of the present invention, a piezoelectric device based on the piezoelectric ceramic composition of the present invention is provided.

Hereafter, a detailed description of the present invention will be provided.

A composite oxide, a main component of the piezoelectric ceramic composition according to the present invention is a PZT based composite oxide, a B-site of which is partially substituted with cobalt and tungsten, and which can be expressed by formula 1, below.

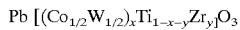  Formula 1 wherein, $0.001 \leq x \leq 0.04$, and $0.35 \leq y \leq 0.55$

In addition, the piezoelectric ceramic composition comprises $Cr_2O_3$ in an amount of 0.01 to 2 wt %, $MnO_2$ in an amount of 0.1 to 0.5 wt %, and an additive in an amount of 0.01 to 2.0 wt %, based on the total weight of the piezoelectric ceramic composition, in which the additive is selected from the group consisting of CoO, MgO, ZnO, $Al_2O_3$, $Fe_2O_3$, $Sb_2O_3$, $SnO_2$, $CeO_2$, $Nb_2O_5$, $V_2O_5$ and $WO_3$, and mixtures thereof.

Mostly comprising $Pb(Ti, Zr)O_3$, PZT based ($ABO_3$ composite perovskite) ceramic composition is generally applied to a high frequency ceramic oscillator and a filter owing to an excellent piezoelectricity and a small particle size.

To broaden the ranges of temperature stability and a piezoelectricity according to a variation of frequency, the PZT based ceramic composition, the B-site of which is partially substituted with $(Co_{1/2}W_{1/2})$, is used as the main component of the piezoelectric ceramic composition according to the present invention. $(Co_{1/2}W_{1/2})$ is an antiferroelectric material, which has a relatively high phase transition temperature.

The B-site of the PZT based ceramic composition is partially substituted with $(Co_{1/2}W_{1/2})$, so that a drop in the phase transition temperature is reduced, and so a loss of heat resistance according to a reduction of Tc is prevented, because Tc remains high.

In formula 1, $(Co_{1/2}W_{1/2})$ is added to the piezoelectric ceramic composition in such a way that x ranges from 0.001 to 0.04, preferably 0.025 to 0.035. For example, if x deviates from the above range, Kp value is too low or high, and thus a desired bandwidth value is not satisfied. Also, when too much Co or W are added, the piezoelectric ceramic composition is reduced in heat resistance because the Tc of the composition becomes low.

Additionally, in formula 1, Zr is added to the piezoelectric ceramic composition in such a way that y ranges from 0.35 to 0.55, preferably 0.46 to 0.50. For example, when Zr content deviates from the above range, Zr deviates from a MPB region, and thus TCF value is not satisfied and a piezoelectric effect is not sufficiently exerted because Kp value is too low.

As described above, 0.01 to 2 wt %, preferably 1 to 2 wt % of $Cr_2O_3$ based on the total weight of the piezoelectric ceramic composition is added to the main component, i.e. the PZT based ceramic composition, B-site of which is partially substituted with $(Co_{1/2}W_{1/2})$. $Cr_2O_3$ increases a thermal stability of the piezoelectric composition. When more than 2 wt % of $Cr_2O_3$ is added to the main component, desired physical properties of the piezoelectric ceramic composition become poor because a second phase is formed. On the other hand, when less than 0.01 wt % of $Cr_2O_3$ is added to the main component, an increase in the thermal stability of the piezoelectric composition is negligible.

Furthermore, 0.1 to 0.5 wt %, preferably 0.3 to 0.4 wt % of $MnO_2$ based on the total weight of the piezoelectric ceramic composition is added to the main component. When more than 0.5 wt % of $MnO_2$ is added to the main component, desired physical properties of the piezoelectric ceramic composition become poor because a second phase is formed. On the other hand, when less than 0.1 wt % of $MnO_2$ is added to the main component, a prevention of a leakage current cannot be sufficiently accomplished.

Tc is increased by partially substituting B-site of the PZT based composite oxide with $(Co_{1/2}W_{1/2})$. However, an increase of Tc cannot surely secure frequency stability of the piezoelectric ceramic composition. The increase of Tc can just slightly limit a variation in the frequency of the piezoelectric ceramic composition during heat treatment. To secure frequency stability, a specific additive is added to the main component.

Frequency stability is affected by a domain structure formed through a poling process. The domain structure is controlled by domain behavior, which is a variation of a microstructure and an inner crystal structure according to the kinds of additives added to the PZT based composite oxide. Accordingly, the domain behavior can be controlled by adding appropriate additives to the PZT based composite oxide, and thereby frequency stability can be secured.

As described above, 0.01 to 2.0 wt % of any one additive selected from the group consisting of CoO, MgO, ZnO, $Al_2O_3$, $Fe_2O_3$, $Sb_2O_3$, $SnO_2$, $CeO_2$, $Nb_2O_5$, $V_2O_5$ and $WO_3$ is added to the main component expressed by $Pb[(Co_{1/2}W_{1/2})_x Ti_{1-x-y}Zr_y]O_3$ (wherein, $0.001 \leq x \leq 0.04$, and $0.35 \leq y \leq 0.55$). In consideration of variations in a frequency and an electrostatic capacity, it is preferable that CoO is used. For example, when less than 0.01 wt % of the additive is added to the PZT based composite oxide, the desired frequency stability cannot be obtained. On the other hand, when more than 2.0 wt % of the additive is added, desired physical properties of the piezoelectric ceramic composition become poor because a second phase is formed.

Based on Pb, Co, W, Ti, and Zr that are compounded within the above composition range, the ceramic composition of the present invention is useful as a material for piezoelectric devices such as filters, satisfying needed piezoelectric properties such as kp and Qm, as well as having a phase transition temperature of 320° C. or higher, ±30 ppm/° C. in TCF, and an oscillation frequency change of 0.1% or less after reflow. In addition, the piezoelectric ceramic composition further comprises $Cr_2O_3$ for improvement in thermal stability and $MnO_2$ for reduction in leakage current. Upon polarization of the composition, the reduction in leakage current also results in a reduction in the dispersion attributed to nonuniform voltage, thereby increasing the production yield of devices from the composition.

As described above, the piezoelectric ceramic composition in which a B-site of $ABO_3$ composite perovskite is substituted with cobalt and tungsten and additives such as $Cr_2O_3$, $MnO_2$, etc. are added to the piezoelectric ceramic composition can be sintered under atmospheric pressure, and has excellent electric and thermal properties in consideration of a reflow process at 250° C. or higher. That is to say, Fosc variation after reflow is 0.1% or less, a temperature coefficient of resonance frequency (TCF) is i 30 ppm/° C., the phase transition temperature is 320° C. or higher, and a leakage current is reduced in polarization.

Furthermore, a piezoelectric device using the piezoelectric ceramic composition has an excellent heat resistance and piezoelectricity, that is to say, both a frequency change and the leakage current after reflow are minimized.

Therefore, the piezoelectric ceramic composition of the present invention can be advantageously applied to an SMD type ceramic filter with superior area vibration properties, which can be laminated and allows the application of SMT thereto.

Illustrative, but non-limiting examples of the piezoelectric ceramic composition may include the piezoelectric ceramics, ceramic resonate, piezoelectric transducers, piezoelectric buzzers, and filters.

A better understanding of the present invention may be obtained in light of the following examples which are set forth to illustrate, but are not to be construed to limit the present invention.

EXAMPLE 1

Piezoelectric ceramic compositions were prepared according to Table 1, below, and samples for measuring respective piezoelectric properties were prepared from the piezoelectric ceramic compositions.

PbO, $TiO_2$, $ZrO_2$, CoO, $WO_3$, and $Cr_2O_3$ were used as starting materials, and starting materials and each additive weighed in a predetermined proportion according to table 1. After that, starting materials and additives were sufficiently mixed with a ball mill for 24 hours. Also, $MnO_2$ was added to the resulting mixture so that $MnO_2$ was 0.4 wt %, based on the total weight of the piezoelectric composition.

Sufficiently mixed slurry was dried to form dried powder with a particle size of 0.1 to 1.5 $\mu$m. When the slurry is dried, phases should not be separated. If the slurry is separated into one or more layers, perovskite crystals are not formed only in a single phase, but also in a second phase, such as a pyrochlore phase, which is further formed, and so the piezoelectric properties and reliability become poor. Also, when the particle diameter deviates from the above range, a second phase or unreactive raw powder is formed because sufficient energy needed to maintain the single phase is not provided to slurry.

Next, uniformly mixed powder was calcined at 650 to 1000° C. for 1 to 4 hours. At this time, if a single phase crystal is not formed, powder is calcined by two steps. After that, the single phase powder was wet ground to a particle size of 0.1 to 1.2 $\mu$m, and then 1.5 wt % of a PVC binder was mixed with the ground powder.

Thereafter, the resulting powder was shaped under 1 to 3 ton/$cm^2$, followed by being sintered at 1000 to 1350° C. for 1 to 4 hours to produce a plate-shaped sintered body of 23 mm ×18 mm.

Both sides of the sintered body was ground so that a thickness of the sintered body was 0.26 mm, which is the thickness needed to apply the sintered body to a piezoelectric sensor. A surface of the ground sintered body was rinsed and dried, followed by being heat treated with the use of a Ag paste at 600 to 700° C.

To measure a variation of a leakage current of samples, samples were cut in such a way that all samples had the same surface area, and polarized by applying a direct electrical field of 1 to 5 kV/mm to the sample in silicone oil at 100 to 200° C. for 10 to 30 min. Polarized piezoelectric body samples were rinsed, then cut and processed so that a range of antiresonant frequencies centered around 455 kHz.

Resonance frequency (Fr) in a resonance region of area vibration, antiresonant frequency (Fa), TCF, phase transition temperature (Tc), a variation of frequency after reflow at 250° C. and a variation of the leakage current of each sample were measured with the use of HP419A. The results are described in table 1.

A temperature coefficient of resonance frequency (TCF) was calculated by substituting resonance frequency (Fr) measured within a range of $-40 \sim 90°$ C. into equation 1, below.

$$TCF(ppm/°C.) = \frac{F_{r(90°C.)} - F_{r(-40°C.)}}{130 F_{r(25°C.)}} \quad \text{Equation 1}$$

TABLE 1

| No. | $Pb[(Co_{1/2}W_{1/2})_xTi_{1-x-y}Zr_y]O_3$ X | y | $Cr_2O_3$ amount (wt %) | [1]Addi. | [1]Addi. amount (wt %) | TCF (ppm/° C.) | Tc (° C.) | Δ Fr (%) |
|---|---|---|---|---|---|---|---|---|
| 1* | 0 | 0.35 | 0.001 | CoO | 0.1 | 125 | 384 | 0.15 |
| 2* | 0 | 0.40 | 0.01 | $Fe_2O_3$ | 0.01 | 44 | 374 | 0.008 |
| 3 | 0.04 | 0.50 | 1.0 | $Sb_2O_3$ | 1 | 24 | 344 | 0.07 |
| 4* | 0.12 | 0.55 | 2.0 | $SnO_2$ | 2 | 145 | 284 | 0.19 |
| 5* | 0 | 0.60 | 2.5 | $CeO_2$ | 3 | 82 | 312 | 0.16 |
| 6* | 0.01 | 0.30 | 0.001 | $Nb_2O_5$ | 0.1 | 67 | 387 | 0.01 |
| 7 | 0.03 | 0.35 | 0.01 | $V_2O_5$ | 0.01 | −10 | 372 | 0.02 |
| 8 | 0.04 | 0.40 | 0.1 | $WO_3$ | 0.05 | −10 | 350 | 0.007 |
| 9* | 0.12 | 0.45 | 1.0 | CoO | 1 | 35 | 301 | 0.12 |
| 10* | 0 | 0.50 | 2.0 | $Fe_2O_3$ | 2 | −42 | 310 | 0.003 |
| 11 | 0.03 | 0.45 | 0.01 | $Sb_2O_3$ | 0.1 | 27 | 360 | 0.02 |
| 12 | 0.04 | 0.30 | 0.01 | $SnO_2$ | 0.01 | −45 | 364 | 0.04 |
| 13* | 0.12 | 0.35 | 0.1 | $CeO_2$ | 0.05 | −129 | 284 | 0.012 |
| 14* | 0 | 0.40 | 1.0 | $Nb_2O_5$ | 1 | 51 | 372 | 0.017 |
| 15 | 0.01 | 0.45 | 2.0 | $V_2O_5$ | 2 | 12 | 325 | 0.01 |
| 16 | 0.03 | 0.50 | 0.5 | $WO_3$ | 0.1 | −20 | 327 | 0.009 |
| 17 | 0.04 | 0.55 | 0.01 | CoO | 0.1 | 11 | 325 | 0.03 |
| 18* | 0.12 | 0.60 | 0.01 | $Fe_2O_3$ | 0.01 | 40 | 312 | 0.04 |
| 19 | 0.01 | 0.35 | 1.0 | $Sb_2O_3$ | 1 | 11 | 375 | 0.007 |

TABLE 1-continued

| No. | Pb[(Co$_{1/2}$W$_{1/2}$)$_x$Ti$_{1-x-y}$Zr$_y$]O$_3$ x | y | Cr$_2$O$_3$ amount (wt %) | [1]Addi. | Addi. amount (wt %) | TCF (ppm/° C.) | Tc (° C.) | Δ Fr (%) |
|---|---|---|---|---|---|---|---|---|
| 20 | 0.03 | 0.40 | 2.0 | SnO$_2$ | 2 | 24 | 368 | 0.002 |
| 21* | 0.04 | 0.45 | 2.5 | CeO$_2$ | 3 | 26 | 348 | 0.01 |
| 22* | 0.12 | 0.50 | 0.001 | Nb$_2$O$_5$ | 0.1 | 135 | 304 | 0.009 |
| 23* | 0.01 | 0.30 | 0.1 | WO$_3$ | 0.05 | 38 | 362 | 0.01 |
| 24 | 0.03 | 0.35 | 1.0 | CoO | 1 | 17 | 330 | 0.004 |
| 25 | 0.04 | 0.40 | 2.0 | Fe$_2$O$_3$ | 2 | −22 | 324 | 0.004 |
| 26* | 0 | 0.50 | 0.001 | Sb$_2$O$_3$ | 0 | 50 | 384 | 0.02 |
| 27 | 0.01 | 0.55 | 0.01 | SnO$_2$ | 0.01 | 20 | 364 | 0.05 |
| 28 | 0.03 | 0.45 | 0.1 | CeO$_2$ | 0.05 | 29 | 362 | 0.009 |
| 29 | 0.04 | 0.50 | 1.0 | CoO | 1 | 17 | 350 | 0.01 |
| 30* | 0.12 | 0.55 | 2.0 | CeO$_2$ | 2 | 156 | 281 | 0.012 |
| 31* | 0.2 | 0.60 | 2.5 | Nb$_2$O$_5$ | 3 | 39 | 292 | 0.01 |
| 32* | 0 | 0.40 | 0 | V$_2$O$_5$ | 0.05 | −142 | 397 | 0.03 |

[1]Additives
*Comparative example

From the results shown in Table 1, it can be seen that piezoelectric ceramic composition of the present invention is 0.1% or less in Fosc variation after reflow, ±30 ppm/° C. in a temperature coefficient of resonance frequency (TCF), 320° C. or higher in the phase transition temperature, and has excellent piezoelectric properties in a reflow process at 250° C. or higher.

EXAMPLE 2

The procedure of example 1 was repeated except that a piezoelectric ceramic composition comprises Pb[(Co$_{1/2}$W$_{1/2}$)$_{0.04}$Ti$_{0.48}$Zr$_{0.48}$]O$_3$, 2 wt % of Cr$_2$O$_3$, and MnO$_2$ in an amount at Table 2, and samples were prepared from the piezoelectric ceramic composition. A variation of a leakage current according to MnO$_2$ content was measured. The results are described in table 2.

TABLE 2

|  | MnO$_2$ content (wt %) | Leakage current (A) |
|---|---|---|
| 33 | 0 | 0.54 |
| 34 | 0.1 | 0.28 |
| 35 | 0.3 | 0.06 |
| 36 | 0.5 | 0.45 |
| 37 | 0.7 | 0.79 |
| 38 | 0.9 | 1.20 |

As apparent from the result shown in table 2, the leakage current is reduced by adding 0.1 to 0.5 wt % of MnO$_2$ to the piezoelectric ceramic composition. Also, the piezoelectric ceramic composition of the present invention has advantages in that a heat resistance is maintained without variation even though the amount of an added MnO$_2$ is increased, a stability of frequency change, the capacitance change, and coupling factor (k) change is secured.

As described above, a piezoelectric ceramic composition of the present invention and a piezoelectric device using the piezoelectric ceramic composition satisfy piezoelectric properties such as kp and Qm needed for a piezoelectric material, and are 320° C. or higher in phase transition temperature, ±30 ppm/° C. in temperature coefficient of resonance frequency (TCF), 0.1% or less in oscillation frequency change after reflow, and have good piezoelectric properties such that the leakage current is reduced.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A piezoelectric ceramic composition comprising a main component represented by the following formula 1, Cr$_2$O$_3$ in an amount of 0.01 to 2 wt %, MnO$_2$ in an amount of 0.1 to 0.5 wt %, and an additive in an amount of 0.01 to 2.0 wt %, based on the total weight of the piezoelectric ceramic composition, said additive being selected from the group consisting of CoO, MgO, ZnO, Al$_2$O$_3$, Fe$_2$O$_3$, Sb$_2$O$_3$, SnO$_2$, CeO$_2$, Nb$_2$O$_5$, V$_2$O$_5$, WO$_3$ and mixtures thereof:

$$Pb[(Co_{1/2}W_{1/2})_xTi_{1-x-y}Zr_y]O_3 \quad \text{Formula 1}$$

wherein, $0.001 \leq x \leq 0.04$, and $0.35 \leq y \leq 0.55$.

2. The piezoelectric ceramic composition according to claim 1, wherein x ranges from 0.025 to 0.035.

3. The piezoelectric ceramic composition according to claim 1, wherein y ranges from 0.46 to 0.50.

4. The piezoelectric ceramic composition according to claim 1, wherein Cr$_2$O$_3$ ranges from 1 to 2 wt %.

5. The piezoelectric ceramic composition according to claim 1, wherein MnO$_2$ ranges from 0.3 to 0.4 wt %.

6. The piezoelectric ceramic composition according to claim 1, wherein said additive is CoO.

7. A piezoelectric device, using the piezoelectric ceramic composition of claim 1.

8. The piezoelectric device according to claim 7, wherein the piezoelectric device is selected from the group consisting of piezoelectric ceramics, ceramic resonates, piezoelectric transducers, piezoelectric buzzers, and filters.

9. The piezoelectric device according to claim 7, wherein the piezoelectric device uses piezoelectric ceramic's area vibration mode.

* * * * *